(12) United States Patent
Bergman et al.

(10) Patent No.: US 9,736,947 B1
(45) Date of Patent: Aug. 15, 2017

(54) NANO-COPPER VIA FILL FOR ENHANCED THERMAL CONDUCTIVITY OF PLATED THROUGH-HOLE VIA

(71) Applicant: Multek Technologies Ltd., San Jose, CA (US)

(72) Inventors: Mark Bergman, Redwood City, CA (US); Joan K. Vrtis, Mesa, AZ (US); Michael James Glickman, Mountain View, CA (US)

(73) Assignee: Multek Technologies, Ltd., San Jose, CA (US)

( * ) Notice: Subject to any disclaimer, the term of this patent is extended or adjusted under 35 U.S.C. 154(b) by 0 days.

(21) Appl. No.: 14/572,636

(22) Filed: Dec. 16, 2014

Related U.S. Application Data

(60) Provisional application No. 61/916,722, filed on Dec. 16, 2013.

(51) Int. Cl.
*H05K 3/42* (2006.01)
*H05K 1/02* (2006.01)
*H05K 1/11* (2006.01)

(52) U.S. Cl.
CPC ............. *H05K 3/42* (2013.01); *H05K 1/0201* (2013.01); *H05K 1/115* (2013.01); *H05K 2201/0302* (2013.01); *H05K 2203/0338* (2013.01); *H05K 2203/0723* (2013.01)

(58) Field of Classification Search
USPC ......................................................... 174/257
See application file for complete search history.

(56) References Cited

U.S. PATENT DOCUMENTS 7,211,470 B2 * 5/2007 Card .................... H01L 21/486
257/E21.514
7,342,183 B2 * 3/2008 Egitto .................. H05K 3/4069
174/257

(Continued)

FOREIGN PATENT DOCUMENTS

JP 2008078454 A 4/2008
JP 2015012022 A 1/2015

(Continued)

OTHER PUBLICATIONS

Understanding the Influence of Copper Nanoparticles on Thermal Characteristics and Microstructural Development of a Tin-Silver Solder D.C. Lin, T.S. Srivatsan, G-X. Wang, and R. Kovacevic (Submitted Jan. 12, 2006; in revised form Oct. 10, 2006).*

(Continued)

*Primary Examiner* — Timothy Thompson
*Assistant Examiner* — Michael F McAllister
(74) *Attorney, Agent, or Firm* — Haverstock & Owens LLP

(57) ABSTRACT

A process of constructing a filled via of a printed circuit board comprises drilling a via hole through a body of the printed circuit board, desmearing a barrel of the via hole, metallizing a outer surface of the via barrel, electroplating the via barrel, pushing nano-copper solder into the via hole and heating the circuit board in order to melt the nano-copper solder within the via hole. The nano-copper solder improves the thermal conductivity of the printed circuit board for applications when heat needs to be conducted from one side of the printed circuit board to another.

5 Claims, 3 Drawing Sheets

(56) References Cited

U.S. PATENT DOCUMENTS

| | | | | |
|---|---|---|---|---|
| 2004/0000425 | A1* | 1/2004 | White | H01F 41/041 |
| | | | | 174/250 |
| 2006/0131440 | A1* | 6/2006 | Yen | B01F 3/1214 |
| | | | | 239/102.2 |
| 2007/0077682 | A1* | 4/2007 | Cerio | C23C 14/046 |
| | | | | 438/99 |
| 2007/0221404 | A1* | 9/2007 | Das | H05K 3/4623 |
| | | | | 174/264 |
| 2009/0004438 | A1 | 1/2009 | Urakawa | |
| 2009/0083975 | A1* | 4/2009 | Lee | B82Y 10/00 |
| | | | | 29/830 |
| 2009/0301606 | A1* | 12/2009 | Ueshima | B23K 35/0244 |
| | | | | 148/24 |
| 2010/0000762 | A1* | 1/2010 | Yang | H05K 3/1283 |
| | | | | 174/126.1 |
| 2013/0069014 | A1* | 3/2013 | Lee | H01B 1/22 |
| | | | | 252/512 |
| 2013/0209672 | A1* | 8/2013 | Reinmuth | H05K 3/4061 |
| | | | | 427/97.8 |
| 2013/0216699 | A1* | 8/2013 | Yamaguchi | H05K 3/0094 |
| | | | | 427/97.8 |
| 2015/0114707 | A1* | 4/2015 | Glickman | H05K 1/0206 |
| | | | | 174/264 |

FOREIGN PATENT DOCUMENTS

| | | |
|---|---|---|
| KR | 10-0887133 B1 | 3/2009 |
| KR | 10-0891814 B1 | 4/2009 |

OTHER PUBLICATIONS

A Reliability Study of Nanoparticles Reinforced Composite Lead-Free Solder Si Chen1, Lili Zhang1, Johan Liu1 (Received Dec. 7, 2009; Accepted May 19, 2010; Published Sep. 25, 2010).*

Understanding the Influence of Copper Nanoparticles on Thermal Characteristics and Microstructural Development of a Tin Silver Solder D.C. Lin, T.S. Srivatsan, G-X. Wang, and R. Kovacevic (Submitted Jan. 12, 2006; in revised form Oct. 10, 2006).*

A Reliability Study of Nanoparticles Reinforced Composite Lead-Free Solder Si Chen, Lili Zhang, Johan Liu (Received Dec. 7, 2009; Accepted May 19, 201 O; Published Sep. 25, 2010).*

Recent Development of Nano-solder Paste for Electronics Interconnect Applications Johan Liu, Cristina Andersson, Yulai Gao and Qijie Zhai 2008 10th Electronics Packaging Technology Conference.*

* cited by examiner

NANO-COPPER VIA FILL FOR ENHANCED THERMAL CONDUCTIVITY OF PLATED THROUGH-HOLE VIA

RELATED APPLICATIONS

This Patent Application claims priority under 35 U.S.C. 119(e) of the U.S. provisional patent application, Application No. 61/916,722, filed on Dec. 17, 2013, and entitled "NANO-COPPER VIA FILL FOR THERMAL PLATED THROUGH HOLE APPLICATIONS," which is also hereby incorporated by reference in its entirety.

FIELD OF THE INVENTION

The present invention is generally directed to printed circuit boards and methods of constructing through-hole vias. More specifically, the present invention is directed to a method of constructing a printed circuit board comprising one or more electroplated through hole vias comprising a nano-copper fill.

BACKGROUND OF THE INVENTION

In cases where a heat source (such as a power amplifier) must dissipate heat to a heat-sink or case on the opposite side of the printed circuit board (PCB), it is necessary to obtain a high thermal conductivity in the z-axis of the PCB. It is a common practice to drill and plate copper on an array of plated through-hole vias to thermally connect one side of the circuit board to the other. However, it is time consuming and often unreliable to plate copper on more than a small percentage of the hole. For this reason conductive fillers are often placed in the via. However, conductive filler typically makes a negligible contribution to overall thermal conductivity. Additionally, filling the via with a traditional solder has a low thermal conductivity and may also flow out during subsequent processing.

SUMMARY OF THE INVENTION

A process of constructing a filled via for a printed circuit board utilizing a nano-copper solder comprises drilling one or more via holes through a thickness of the printed circuit board and pushing a portion of nano-copper solder into the one or more via holes. The printed circuit board is heated and the nano-copper solder is melted within the via holes. The nano-copper solder is used to fill a electroplated through-hole of the printed circuit board in order to improve thermal conductivity for applications where heat needs to be conducted from one side of the printed circuit board to another. The nano-copper solder has a range of particle sizes in order to improve particle packing density.

In one aspect a process of constructing a filled via of a printed circuit board comprises drilling a via hole through a body of the printed circuit board, desmearing a barrel of the via hole, metallizing a outer surface of the via barrel, electroplating the via barrel, pushing nano-copper solder into the via hole and heating the circuit board in order to melt the nano-copper solder within the via hole. In some embodiments, the circuit board is heated to approximately 200° C. The melting point of the nano-copper solder is raised after it is melted. In some embodiments, the barrel is metallized using an electroless copper plating solution before copper is electroplated into the via barrel. The nano-copper solder is able to be pushed into the via hole by a variety of mechanisms including using a stencil printer and vacuum table, by hand with a squeegee and vacuum table, or pushed from one side of the via and pulled from the opposite side of the via. In some embodiments, a capping layer of electroplated copper is added to the printed circuit board.

In another aspect, a method of improving the thermal conductivity of a printed circuit board comprises drilling one or more holes through a body of the circuit board, depositing a portion of nano-copper within the one or more through-holes and heating the circuit board in order to melt the nano-copper within the one or more through-holes. In some embodiments, the circuit board is heated to approximately 200° C. The melting point of the nano-copper solder is raised after it is melted. In some embodiments, a barrel of the one or more through-holes is metallized using an electroless copper plating solution before copper is electroplated into the via barrel. The nano-copper solder is able to be pushed into the one or more through-holes by a variety of mechanisms including using a stencil printer and vacuum table, by hand with a squeegee and vacuum table, or pushed from one side of the via and pulled from the opposite side of the via. In some embodiments, a capping layer of electroplated copper is added to the printed circuit board.

In a further aspect, a printed circuit board comprises a printed circuit board body and one or more electroplated via holes passing through the body, wherein each via hole comprises a nano-copper solder deposited within the via. In some embodiments, the circuit board is heated to approximately 200° C. in order to melt the nano-copper solder and the melting point of the nano-copper solder is raised after it is melted. In some embodiments, a barrel of each via hole is metallized using an electroless copper plating solution and copper is electroplated into the via barrel. The nano-copper solder is able to be pushed into the one or more via holes by a variety of mechanisms including using a stencil printer and vacuum table, by hand with a squeegee and vacuum table, or pushed from one side of the via and pulled from the opposite side of the via. In some embodiments, a capping layer of electroplated copper is added to the printed circuit board. In some embodiments, the nano-copper solder comprises more than one particle size.

BRIEF DESCRIPTION OF THE DRAWINGS

Several example embodiments are described with reference to the drawings, wherein like components are provided with like reference numerals. The example embodiments are intended to illustrate, but not to limit, the invention. The drawings include the following figures.

DETAILED DESCRIPTION OF THE EMBODIMENTS

Embodiments of the invention are directed to a process of constructing a filled via for a printed circuit board utilizing a nano-copper solder. Nano-copper solder is a dispersion of nano-copper particles that is able to melt at a substantially lower temperature than bulk copper. The nano-copper solder is used to fill a electroplated through-hole of the printed circuit board in order to improve thermal conductivity and for applications where heat needs to be conducted from one side of the printed circuit board to another. One or more via holes are drilled through a thickness of the printed circuit board and a portion of nano-copper solder is pushed into the one or more via holes. The printed circuit board is heated and the nano-copper solder is melted within the via holes. Once the nano-copper solder is melted, the subsequent melting point of the nano-copper solder is raised. The nano-copper solder has a range of particle sizes in order to improve particle packing density.

Reference will now be made in detail to implementations of the nano-copper via fill for electroplated through-hole applications as illustrated in the accompanying drawings. The same reference indicators will be used throughout the drawings and the following detailed description to refer to the same or like parts. In the interest of clarity, not all of the routine features of the implementations described herein are shown and described. It will be appreciated that in the development of any such actual implementation, numerous implementation-specific decisions can be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
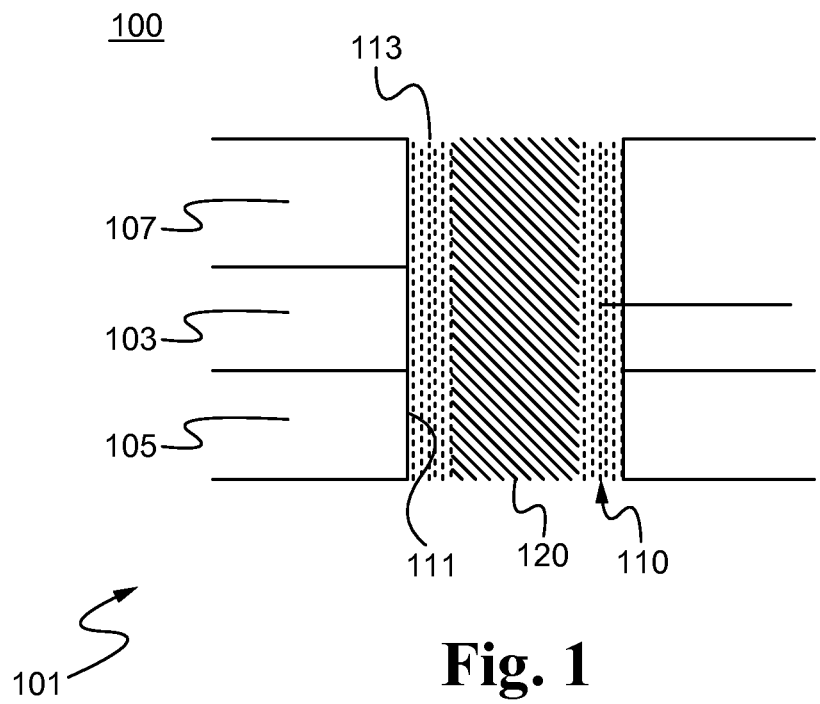
FIG. 1 illustrates a printed circuit board with one or more filled vias in accordance with some embodiments.

Referring now to FIG. 1, a composite printed circuit board is depicted therein. The printed circuit board 100 comprises a middle layer 103, a bottom layer 105, a top layer 107, and one or more via holes 110 passing through a thickness of the circuit board 100. In some embodiments, the one or more via holes 110 or through-holes are drilled through the thickness of the board 100. The one or more via holes 110 comprise a side wall 111 or barrel which are desmeared using wet chemicals or plasma in order to clean the barrel 111. The outer surface of the via barrel 111 is metallized with an electroless copper plating solution and copper 113 is electroplated into the via barrel 111.

After the one or more via holes 110 are prepared, a portion of nano-copper solder 120 is pushed into the one or more via holes 110. The nano-copper solder 120 is able to be pushed into the one or more via holes 110 by a variety of mechanisms including by using a stencil printer and an optional vacuum table, by hand with a squeegee and an optional vacuum table, or by other combination of technologies that pushes materials from one side of the via and/or pull the nano-copper solder 120 from the opposite side of the one or more via holes 110. The printed circuit board 100 with the nano-copper solder 120 is sent through a lead-free solder reflow oven in order to melt the nano-copper solder 120 within the one or more via holes 110. In some embodiments, an optional capping layer of electroplated copper 113 is added before the printed circuit board 100 is sent through the solder reflow oven. Alternatively, a capping layer of electroplated copper 113 is added after the the printed circuit board 100 is sent through the solder reflow oven.

Figure 2:
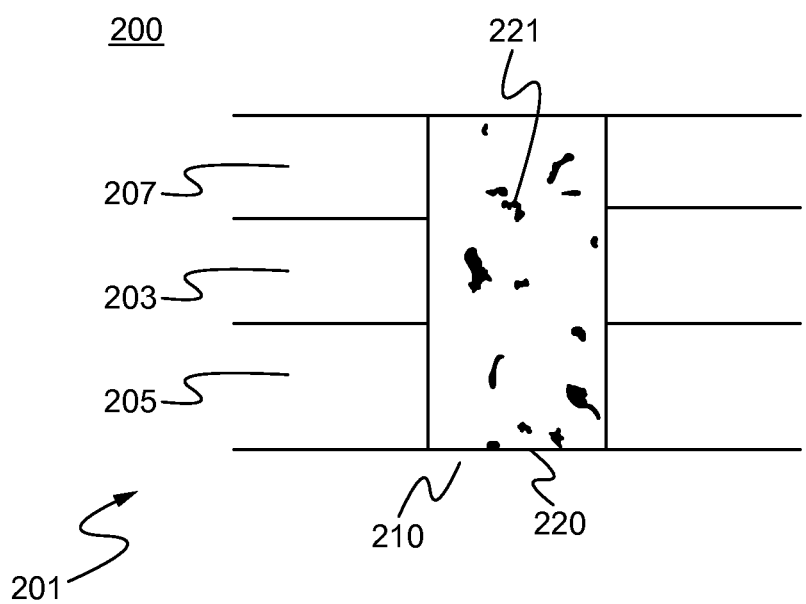
FIG. 2 illustrates a printed circuit board with one or more filled vias in accordance with some embodiments.

FIG. 2 illustrates a printed circuit board 200 with a portion of nano-copper solder 220 melted within one or more via holes 210 of the circuit board 200. The circuit board 200 is similar to the circuit board 100 as described above and comprises a middle layer 203, a bottom layer 205, a top layer 207, and one or more through-hole 210 passing through a thickness of the circuit board 200. As described above, the printed circuit board 200 is sent through a lead-free solder oven in order to melt the nano-copper solder 220 within the one or more via holes 210. As shown in FIG. 2, the nano-copper solder 220 comprises a range of different particle 221 sizes in order to improve particle 221 packing density within the one or more via holes 210.

In some embodiments the nano-copper solder is a dispersion of nanoparticles that is able to melt at 200° C., which is far below the 1085° C. melting point of bulk copper. The nano-copper solder can be used to fill a electrol-plated-through-hole via of a printed circuit board for improved thermal conductivity when heat needs to be conducted from one side of the board to the other. The nano-copper has a high thermal conductivity, so adding nano-copper solder to one or more via holes of the printed circuit board greatly increases the overall thermal conductivity of the one or more vias. In addition, the melting point of the nano-copper solder is raised after the solder reflow, so there is no ouflow of the nano-copper solder during subsequent lead-free solder reflow cycles. Further, as described above, the nano-copper solder comprises a range of nano-copper particle sizes in order to improve particle packing density. In some embodiments, the solvent for the nano-copper solder comprises a volatile organic.

Figure 3:
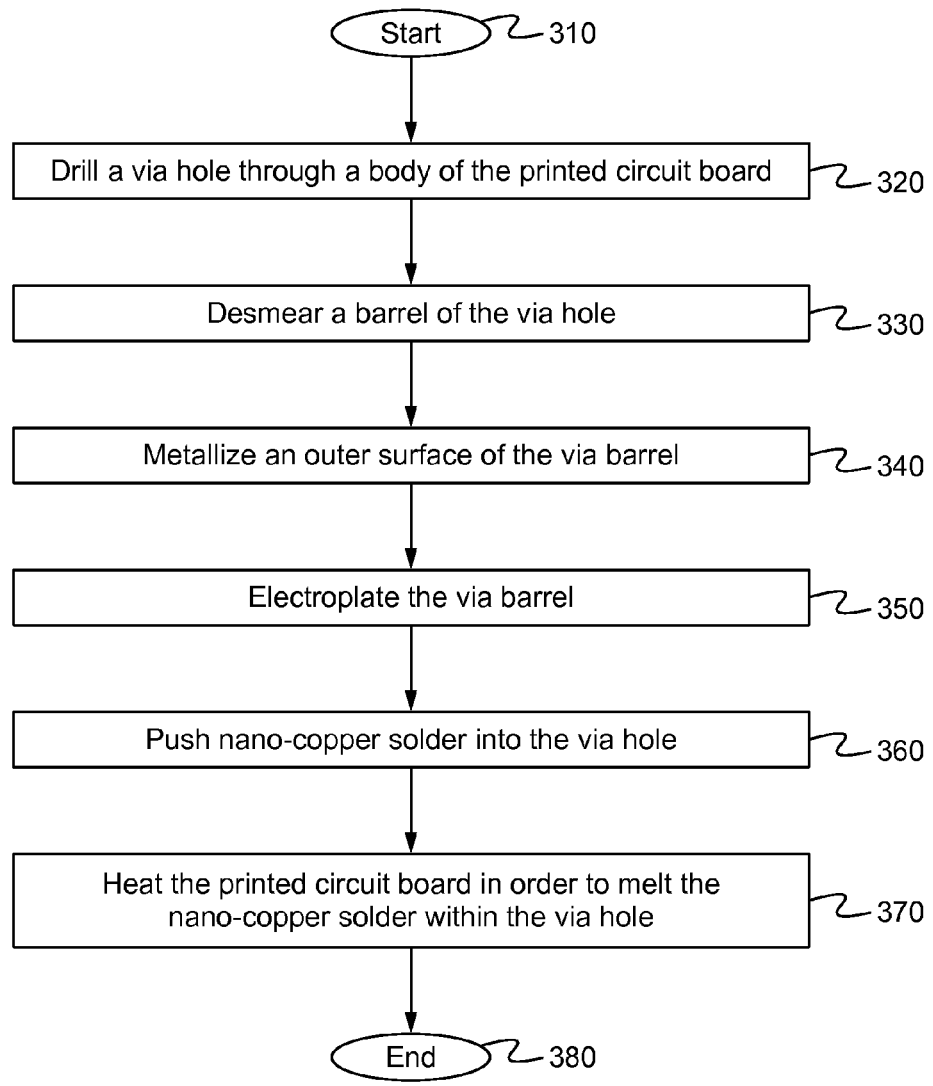
FIG. 3 illustrates a process of constructing a filled via of a printed circuit board in accordance with some embodiments.

FIG. 3 illustrates a process of constructing a filled via of a printed circuit board in accordance with some embodiments. The process begins in the step 310. In the step 320, a mechanical drill drills a via hole through a thickness of the printed circuit board. In some embodiments, the printed circuit board is a composite circuit board such as described in relation to FIGS. 1 and 2 above. Particularly, the circuit board is able to be any appropriate circuit board in which it is desired to improve the thermal conductivity of the circuit board. In the step 330 the via barrel or sidewalls of the via hole are desmeared. The sidewalls are able to be desmeared using wet chemicals or a plasma in order to clean and prepare the inside of the via barrel. Then in the step 340, an outer surface of an interior of the via barrel is metallized. For example, in some embodiments, the surface on the interior of the via barrel is metallized using an electroless copper plating solution. In the step 350, copper is electroplated into the via barrel and then, in the step 360 a portion of nano-copper solder is pushed into the via hole. The nano-copper solder is able to be pushed into the via hole by a variety of mechanisms including by using a stencil printer and an optional vacuum table, by hand with a squeegee and an optional vacuum table, or by other combination of technologies that pushes materials from one side of the via and/or pull the nano-copper solder from the opposite side of the one or more vias.

In the step 370 the printed circuit board with the nano-copper solder is heated in order to melt the nano-copper solder within the via hole. In some embodiments, the printed circuit board is sent through a conventional lead-free solder reflow oven to melt the nano-copper solder. As described above, once the nano-copper melts its melting point is raised. In some embodiments, an optional capping layer of electroplated copper is added before the printed circuit board is sent through the solder reflow oven. Alternatively, a capping layer of electroplated copper is added after the the printed circuit board is sent through the solder reflow oven. The process ends in the step 380.

Figure 4:
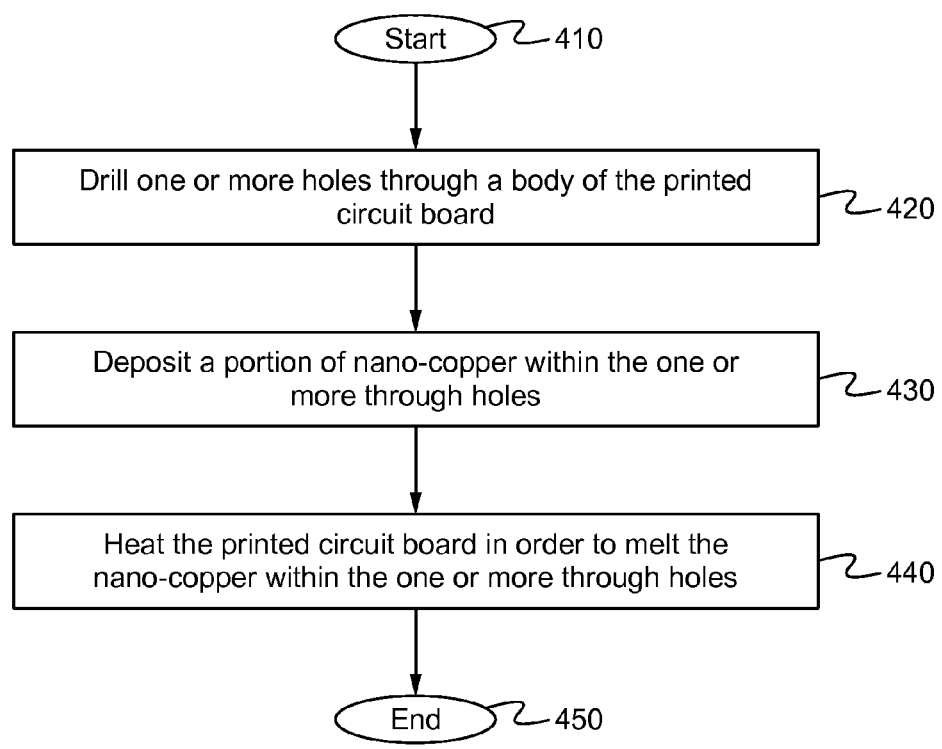
FIG. 4 illustrates a method of improving the thermal conductivity of a printed circuit board in accordance with some embodiments.

As described above, using a nano-copper solder to fill a thermal-plated-through hole of a printed circuit board improves the thermal conductivity in applications where heat needs to be conducted from one side of the printed circuit board to another. FIG. 4 illustrates a method of improving the thermal conductivity of a printed circuit board. The method begins in the step 410. In the step 420, one or more holes are drilled through the body of the printed circuit board. In the step 420, a portion of nano-copper solder is deposited into each of the one or more holes. Before the portion of nano-copper is deposited into each of the one or more holes, each of the through-holes are thermally plated. For example, in some embodiments, the one or more through-hole are desmeared such as described above and the barrels or sidewalls of the holes are metallized using an electroless copper plating solution before copper is electroplated into the barrel. The nano-copper solder is able to be pushed into the via hole by a variety of mechanisms including by using a stencil printer and an optional vacuum table, by hand with a squeegee and an optional vacuum table, or by other combination of technologies that pushes materials from one side of the via and/or pull the nano-copper solder from the opposite side of the one or more vias.

In the step 440, the printed circuit board is heated in order to melt the nano-copper solder within the one or more holes of the printed circuit board. In some embodiments, the printed circuit board is sent through a conventional lead-free solder reflow oven to melt the nano-copper solder. As stated above, because the nano-copper solder has a high thermal conductivity so it is able to increase the overall thermal conductivity of the or via holes of the printed circuit board once the nano-copper solder is melted in place. The method ends in the step 450.

In operation, one or more via holes are drilled through a thickness of a printed circuit board and a portion of portion of nano-copper solder is pushed into the one or more via holes. The printed circuit board is sent through a solder reflow oven in order to melt the nano-copper solder within the one or more via holes. The nano-copper solder is able to improve the thermal conductivity of a printed circuit board by conducting heat from one side of the printed circuit board to another. Particularly, the nano-copper solder has a high thermal conductivity thus is able to increase the overall thermal conductivity of the via.

The nano-copper solder is able to melt at 200° C., which is far below the 1085° C. melting point of copper. In addition, the melting point of the nano-copper is increased after the printed circuit board is sent through the solder reflow oven. Consequently, outflow of the nano-copper solder is prevented during subsequent lead-free solder reflow cycles. Moreover, the nano-copper solder has a range of particle sizes in order to improve particle packing density within the one or more via holes. Accordingly, the process of constructing a filled via for a printed circuit board utilizing a nano-copper solder as described herein has many advantages.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention. Specifically it will be apparent to someone of ordinary skill in the art that the invention is able to be used to introduce a through-hole via into any appropriate printed circuit board.

What is claimed is:

1. A printed circuit board comprising:
   a. a printed circuit board body; and
   b. one or more electroplated via holes passing through the body,
   wherein each via hole comprises a nano-copper solder deposited within the via by pushing the nano-copper solder from one side of the via and pulling the nano-copper solder from an opposite side of the via, wherein the circuit board is heated to approximately 200° C. such that the nano-copper solder is melted, and wherein the melting point of the nano-copper solder is greater than 200° C. after it resolidifies.

2. The printed circuit board of claim 1, wherein a barrel of each via hole is metallized using an electroless copper plating solution.

3. The printed circuit board of claim 2, wherein copper is electroplated into the via barrel.

4. The printed circuit board of claim 1, further comprising an electroplated copper capping layer.

5. The printed circuit board of claim 1, wherein the nano-copper solder comprises more than one particle size.

* * * * *